(12) United States Patent
Li et al.

(10) Patent No.: US 6,530,798 B1
(45) Date of Patent: Mar. 11, 2003

(54) BALL GRID ARRAY SOCKET CONNECTOR

(75) Inventors: Ren-Chih Li, Tu-Chen (TW); Jwomin Wang, Hsin-Dan (TW); Yao-Chi Huang, Yung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/999,804

(22) Filed: Oct. 24, 2001

(51) Int. Cl.[7] .............................................. H01R 13/625
(52) U.S. Cl. ...................................................... 439/342
(58) Field of Search ................................ 439/342, 266, 439/268, 259, 263, 41

(56) References Cited

U.S. PATENT DOCUMENTS

| | | | | |
|---|---|---|---|---|
| 6,019,617 A | * | 2/2000 | Liu et al. ..................... | 439/135 |
| 6,155,848 A | * | 12/2000 | Lin .............................. | 439/135 |
| 6,338,639 B1 | * | 1/2002 | Trout et al. ................. | 439/342 |

* cited by examiner

Primary Examiner—Tho D. Ta
Assistant Examiner—Ann McCamey
(74) Attorney, Agent, or Firm—Wei Te Chung

(57) ABSTRACT

A ball grid array socket connector (1) includes an insulative base (10), a number of conductive contacts (18) fixed to the base, a number of solder balls (30) attached to tail portions (32) of corresponding contacts and a cover (20) movably attached to the base. The base has a top surface (14), a bottom surface (16) and defines a number of cavities (12) through the top surface and the bottom surface. The cavities are arranged in a matrix. The contacts are received in corresponding cavities of the base. The base provides a number of stand-offs (28) which downwardly protrude from the bottom surface of the base and terminate at a plane (D) generally parallel with the bottom surface of the base. The solder balls each have a bottom tip (31) that downwardly extends beyond the plane D. The base defines a number of notches (26) in the bottom surface thereof. The notches are located at outer sides of the matrix of cavities.

6 Claims, 12 Drawing Sheets

BALL GRID ARRAY SOCKET CONNECTOR

BACKGROUND OF THE INVENTION

1. Field of the Invention

The present invention relates to a connector, and particularly to a ball grid array socket connector used to electrically connecting an integrated circuit (IC) package assembly to a PC board.

2. Description of the Related Art

Ball Grid array (BGA) socket connectors are widely used for electrically connecting an integrated circuit (IC) package to a PC board. A typical BGA socket connector includes a number of solder balls each of which is attached to a tail of a corresponding conductive contact before the connector is mounted onto a PC board. So, during the mount of the connector onto the PC board, the solder balls are heated to about 220~230° C. and become soft or melting and electrically interconnect the conductive contacts with solder pads on the PC board after they are refrigerated. The BGA socket connector has several advantages over other connectors. One obvious advantage is that there are no leads that may be easily damaged during handling. Another advantage is that the solder balls are self-centering on die pads and can be easily attached to the tails of the conductive contacts. Still other advantages include smaller size, fine pitch, high density, better electrical performances, better package yields, and so on.

However, problems can accrue with respect to the mount of the connector onto the PC board. First, the size of the balls should be strictly controlled. If the solder balls are too small, some of the conductive contacts may not be reliably connected to the solder pads on the PC board, therefore open circuits happen. If the solder balls are too large, the redundant solder may bridge with neighbor solder balls, therefore short circuits happen. Second, the solder balls may be collapsed by the weight of the connector and the IC package assembly during the mount. Third, heat may accumulate around the solder balls and is not easily dissipated. The present invention is aimed to address the above issues.

SUMMARY OF THE INVENTION

An object of the present invention is to provide a ball grid array socket connector that can be reliably mounted onto a PC board.

To obtain the above object, a ball grid array socket connector includes an insulative base, a number of conductive contacts fixed to the base, a number of solder balls attached to tail portions of corresponding contacts and a cover movably attached to the base. The base has a top surface, a bottom surface and defines a number of cavities through the top surface and the bottom surface. The cavities are arranged in a matrix. The contacts are, received in corresponding cavities of the base. The base provides a number of stand-offs which downwardly protrude from the bottom surface of the base and terminate at a plane generally parallel with the bottom surface of the base. The solder balls each have a bottom tip that downwardly extends beyond the plane that the stand-offs terminate at. The base defines a number of notches in the bottom surface thereof. The notches locate at outer sides of the matrix of cavities.

Other objects, advantages and novel features of the invention will become more apparent from the following detailed description of the present embodiment when taken in conjunction with the accompanying drawings.

BRIEF DESCRIPTION OF THE DRAWINGS

FIG. 7A is a side planar-view of the connector shown in FIG. 5 and a PC board that the connector is put on but is not substaintially mounted on;

DESCRIPTION OF THE PREFERRED EMBODIMENT

Figure 1:
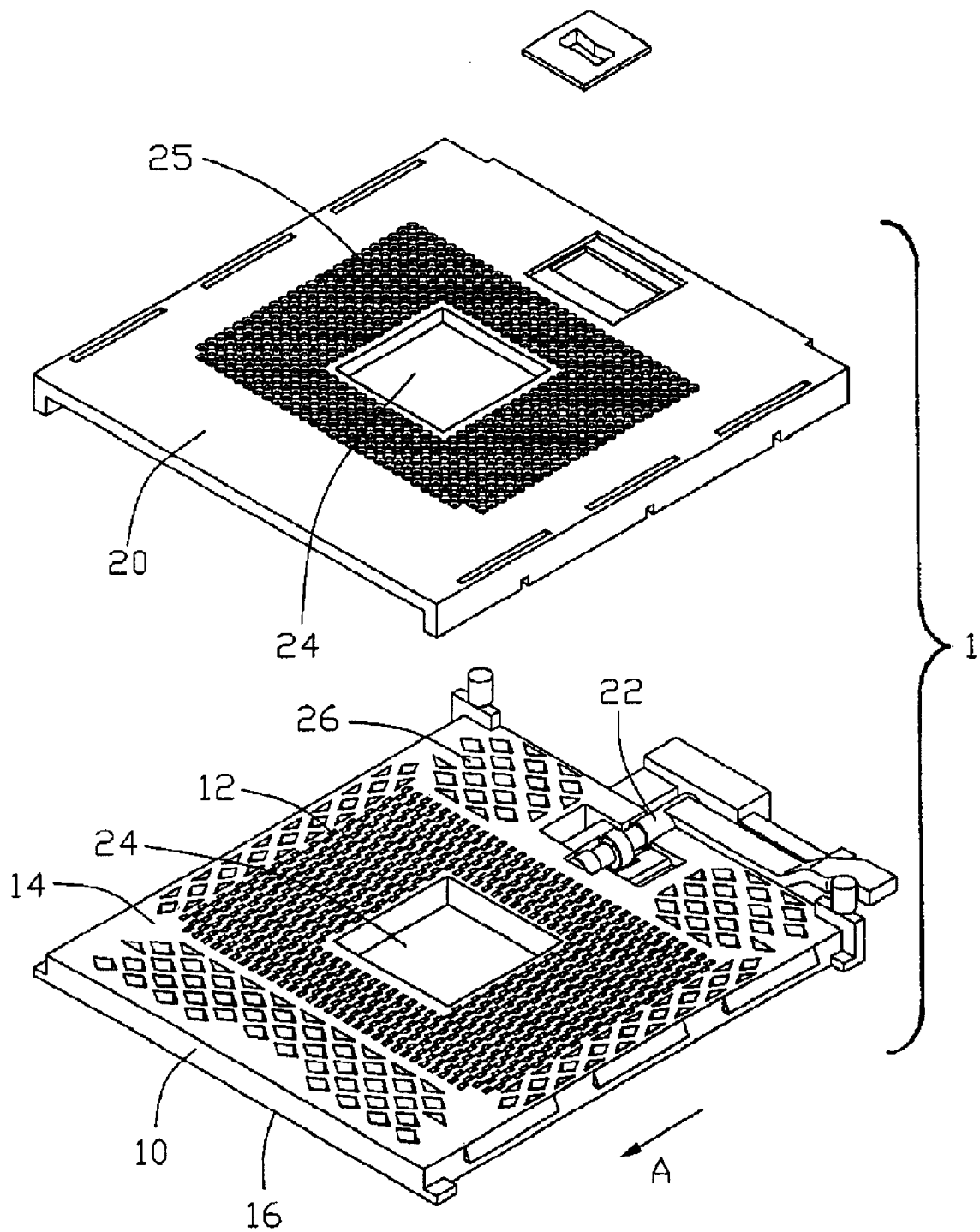
FIG. 1 is an exploded view of an electrical connector in accordance with a first embodiment of the present invention taken from a top perspective.
Figure 2:
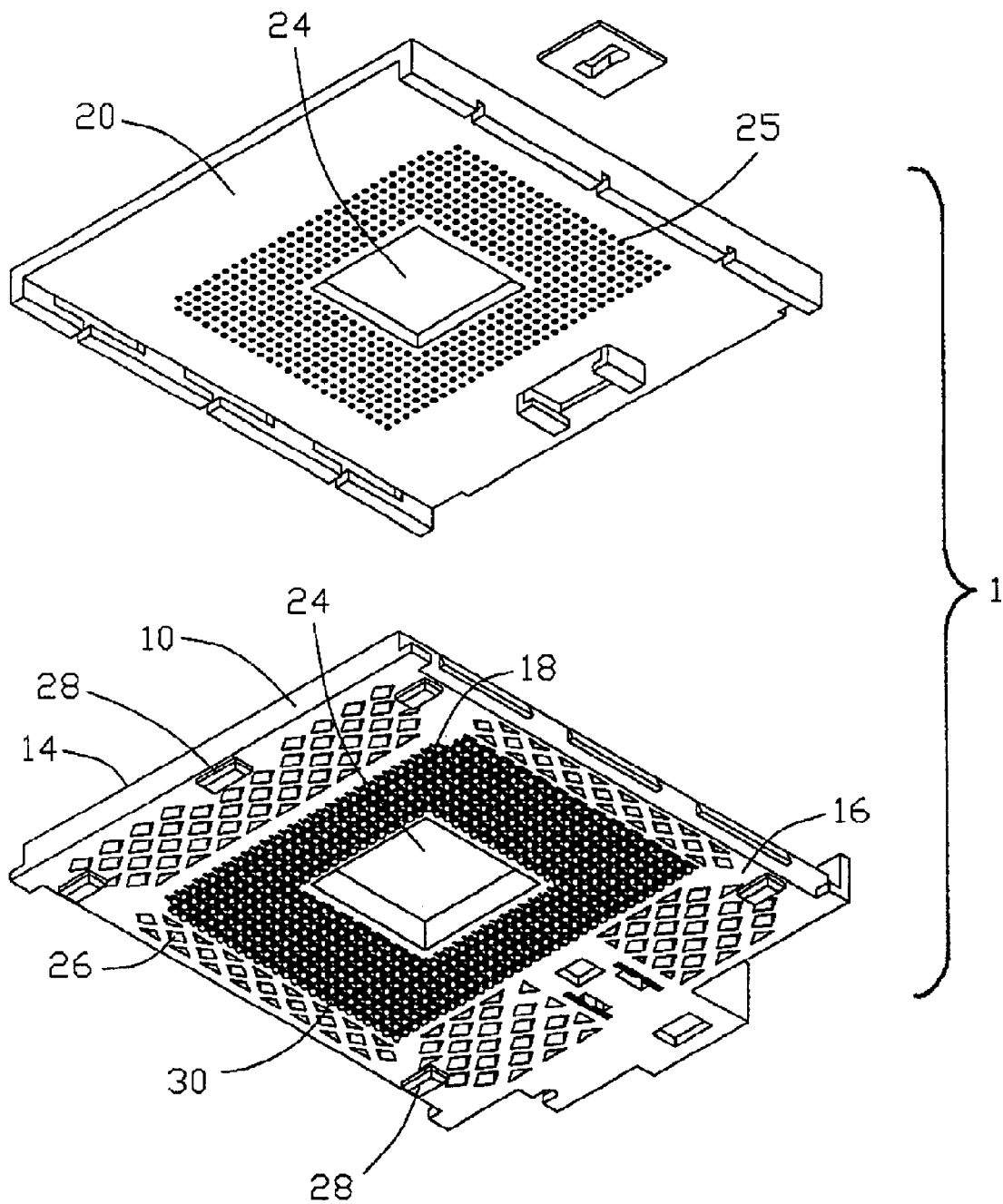
FIG. 2 is a view similar to FIG. 1 but taken from a bottom perspective.
Figure 3:
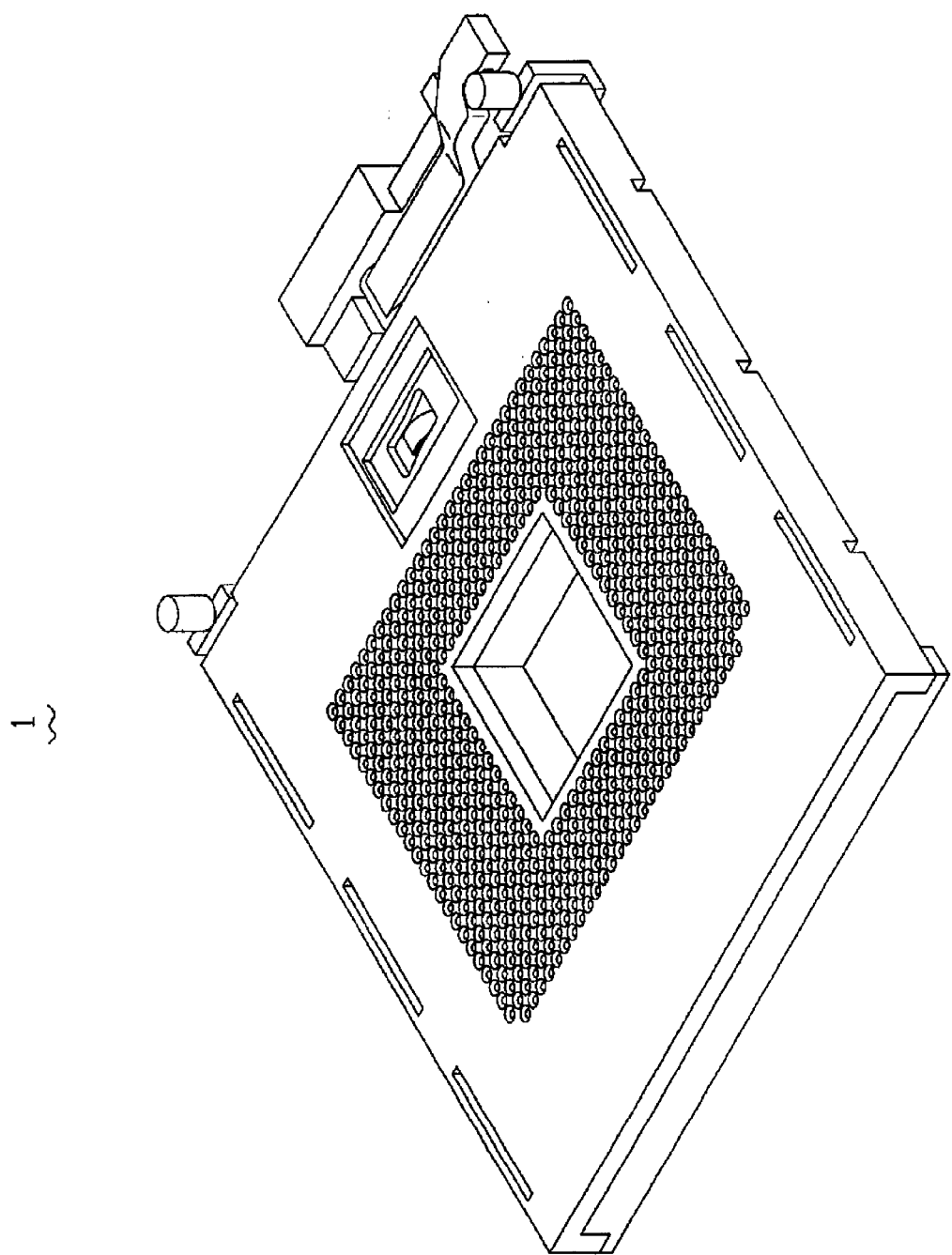
FIG. 3 is an enlarged assembled perspective view of FIG. 1.

Referring to FIGS. 1 and 2, an electrical connector 1 in accordance with a first embodiment of the present invention comprises an insulative base 10 defining a plurality of cavities 12 through a top surface 14 and a bottom surface 16 thereof, a plurality of conductive contacts 18 received in corresponding cavities 12, a cover 20 movably attaching to the base 10 in a direction, designated by "A" arrow, and a driver 22 pivotably assembled to the base 10 for driving the cover 20 relative to the base 10 in the "A" direction. Each of the base 10 and the cover 20 define a generally square hollow 24 at centers thereof. Around the hollow 24, there are a plurality of the cavities 12, which construct a generally square matrix. Further around the cavities 12, there are a plurality of notches 26 located by each side of the matrix of the cavities 12. The notches 26 may be defined through the top and the bottom surfaces 14, 16 of the base 10, called openings (shown in FIGS. 1, 2 and 9) or only defined in the bottom surface 16 and not extend to the top surface 14, called recesses (shown in FIG. 10). The cover defines a plurality of apertures 25 around the hollow 24. The apertures 25 are aligned with the cavities 12 when the cover locates at a certain position relative to the base 10. FIGS. 3–6 illustrate the connector 1 in different perspectives.

Figure 4:
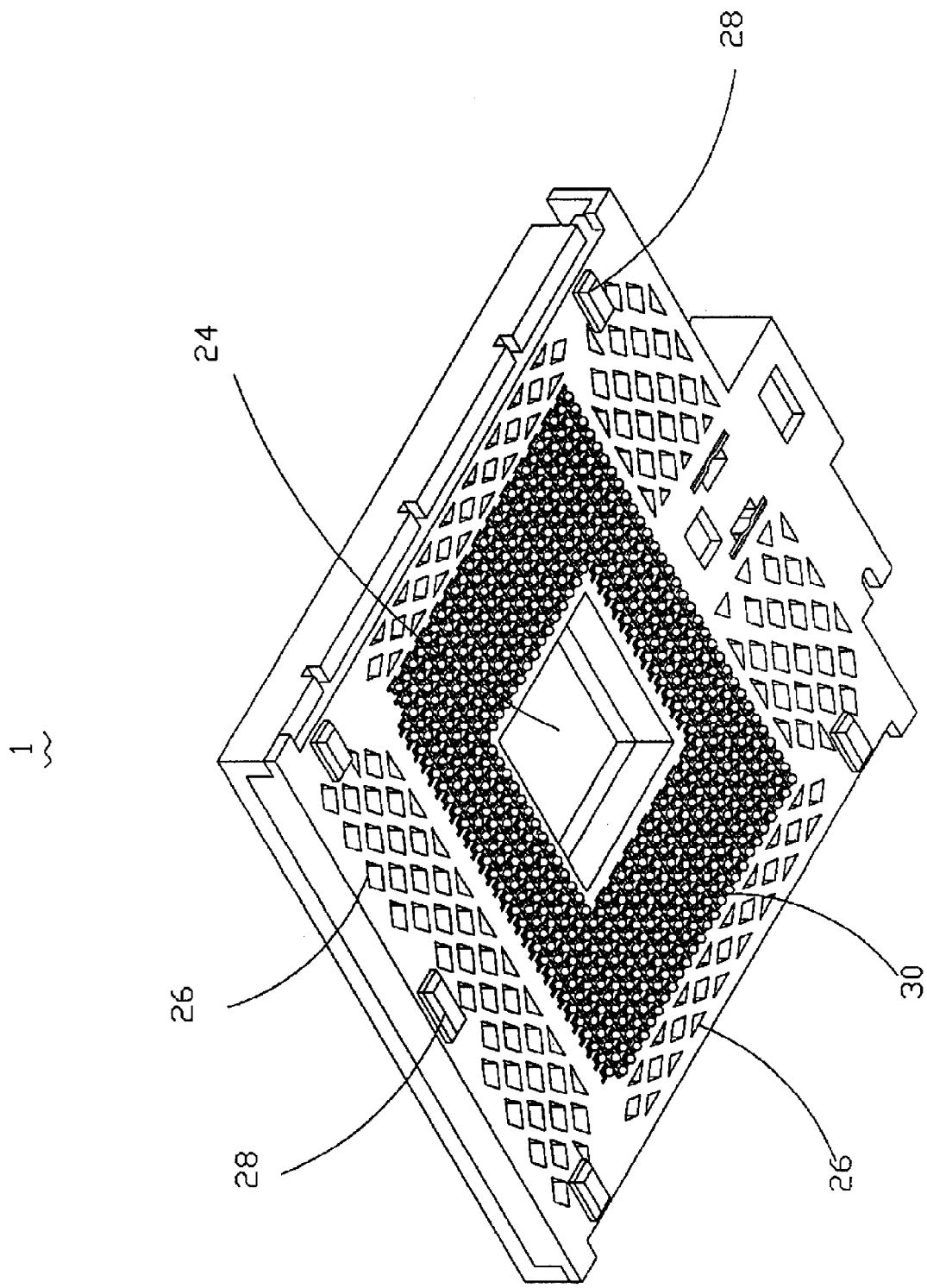
FIG. 4 is an enlarged assembled perspective view of FIG. 2.
Figure 5:
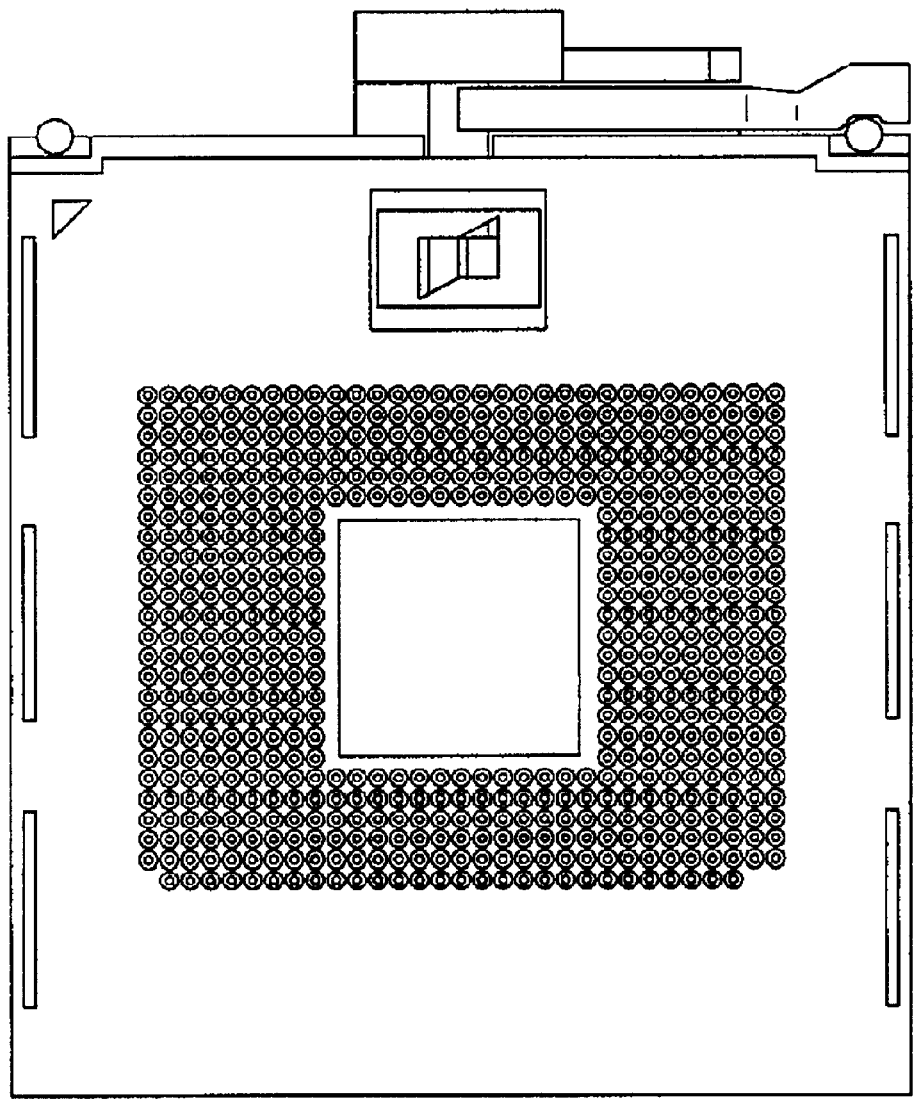
FIG. 5 is a top planar view of FIG. 3.
Figure 6:
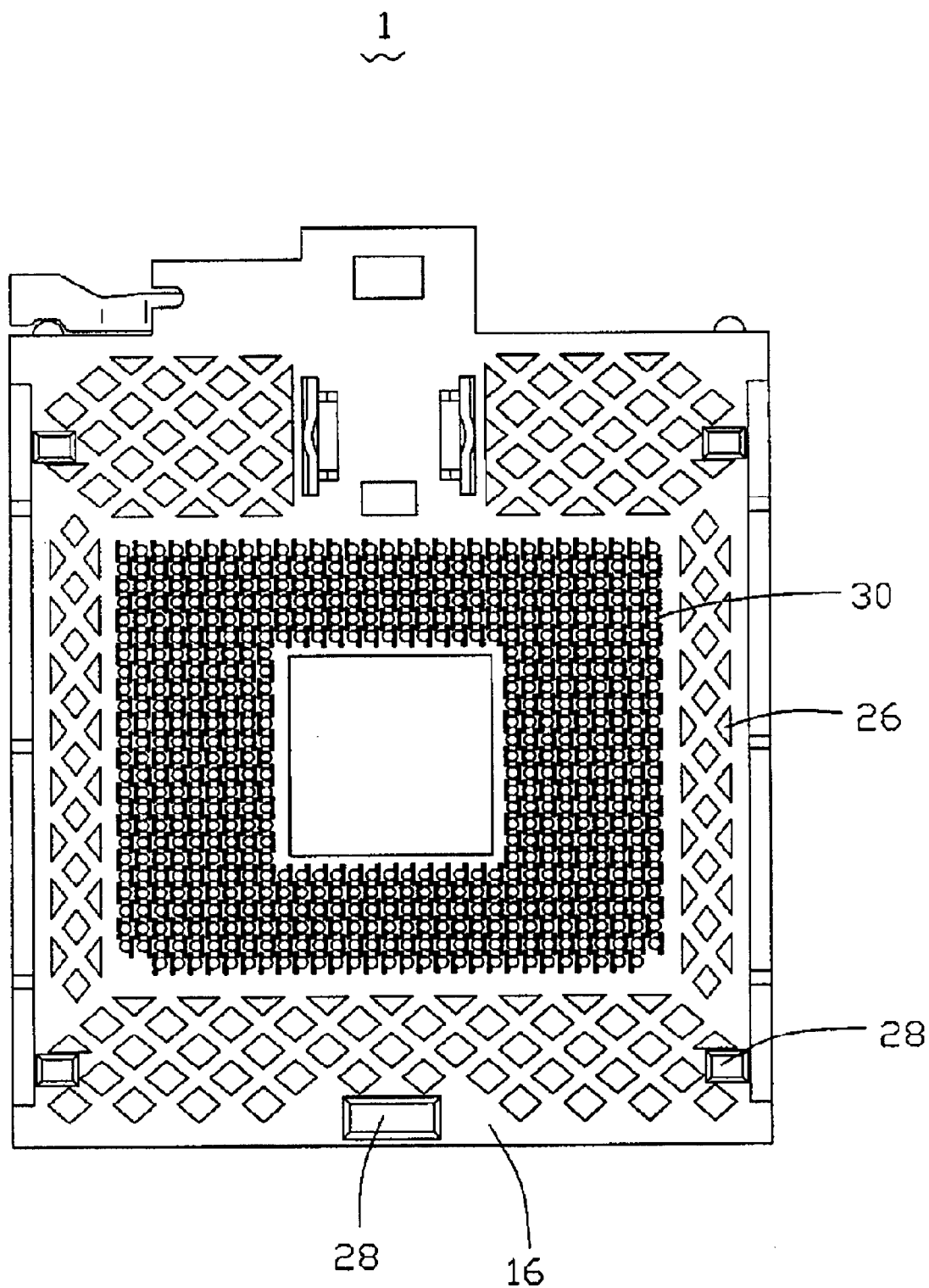
FIG. 6 is a bottom planar view of FIG. 4.
Figure 7A:
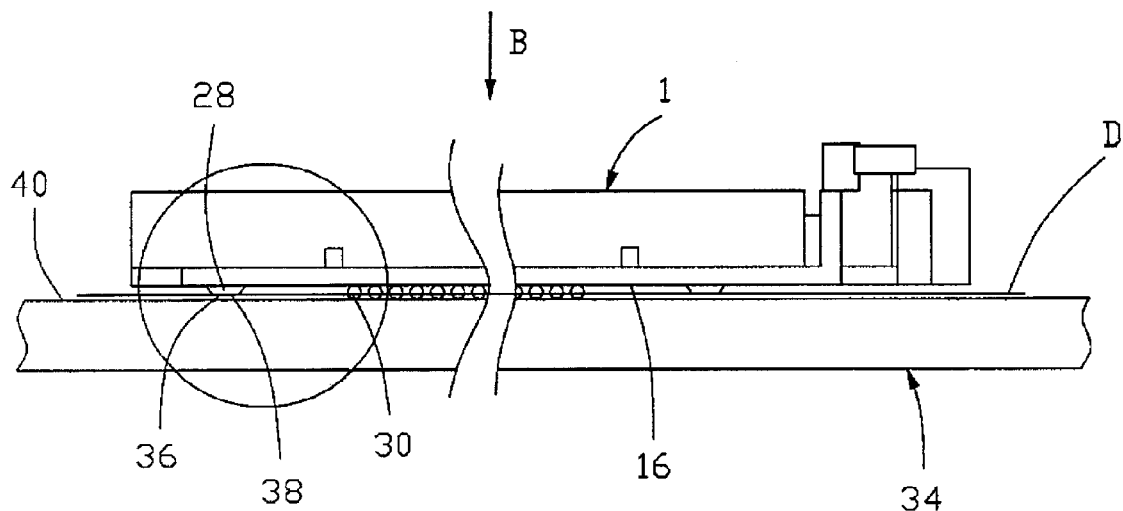
Figure 7B:
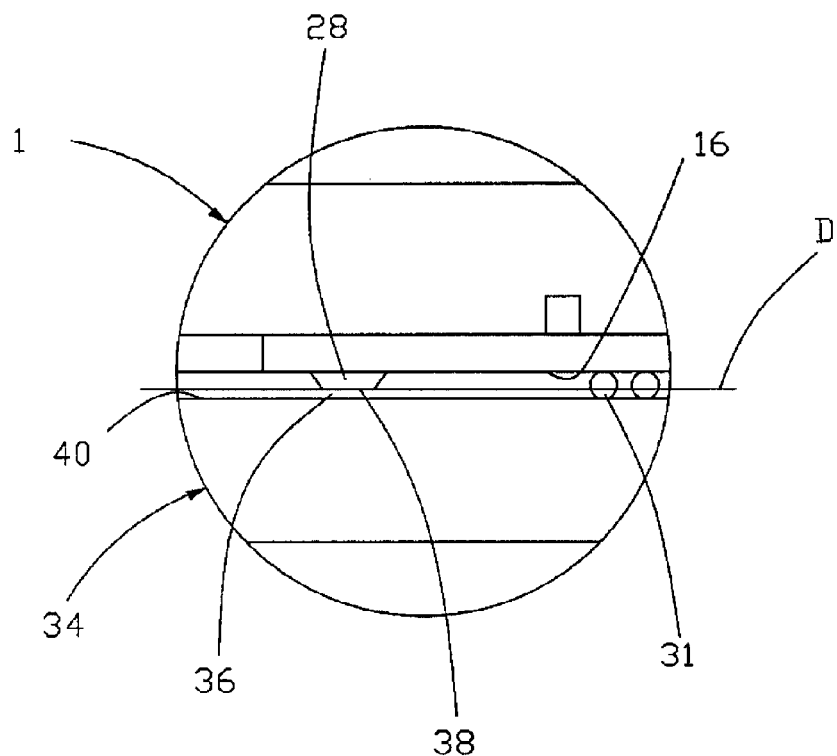
FIG. 7B is a partially enlarged view of FIG. 7A.
Figure 7C:
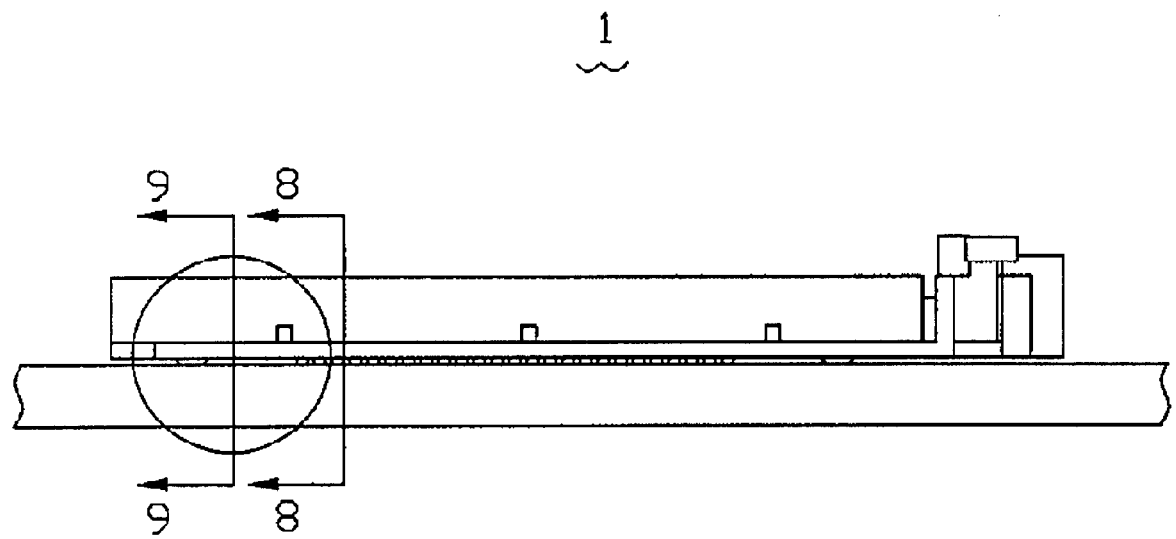
FIG. 7C is a view similar to FIG. 7A but the connector is substaintially mounted to the PC board.
Figure 7D:
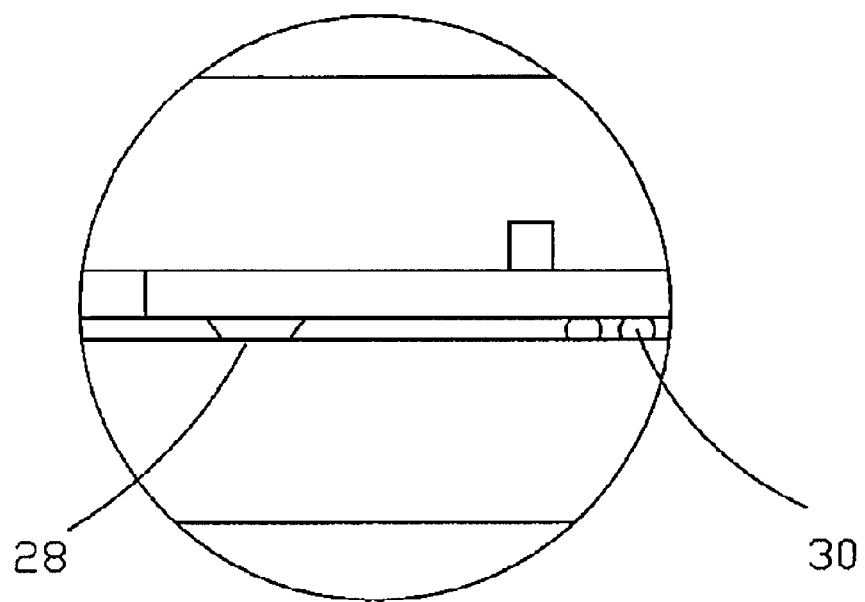
FIG. 7D is a partially enlarged view of FIG. 7C.
Figure 8:
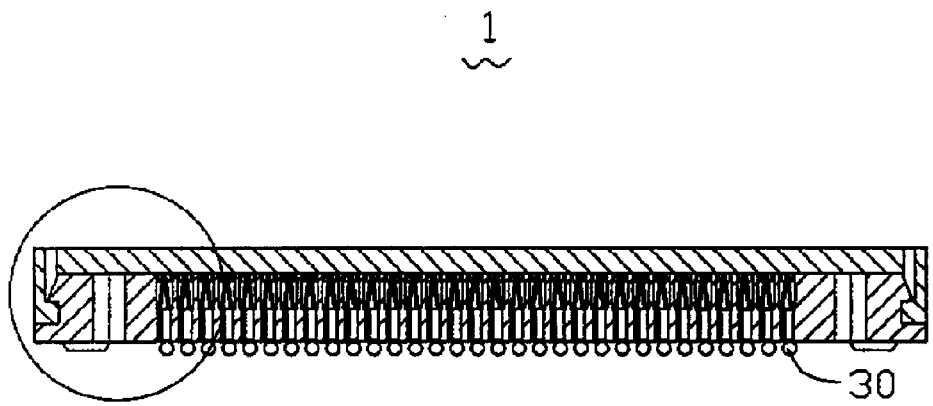
FIG. 8 is a cross-sectional view taken along line VIII—VIII of FIG. 7C.
Figure 8A:
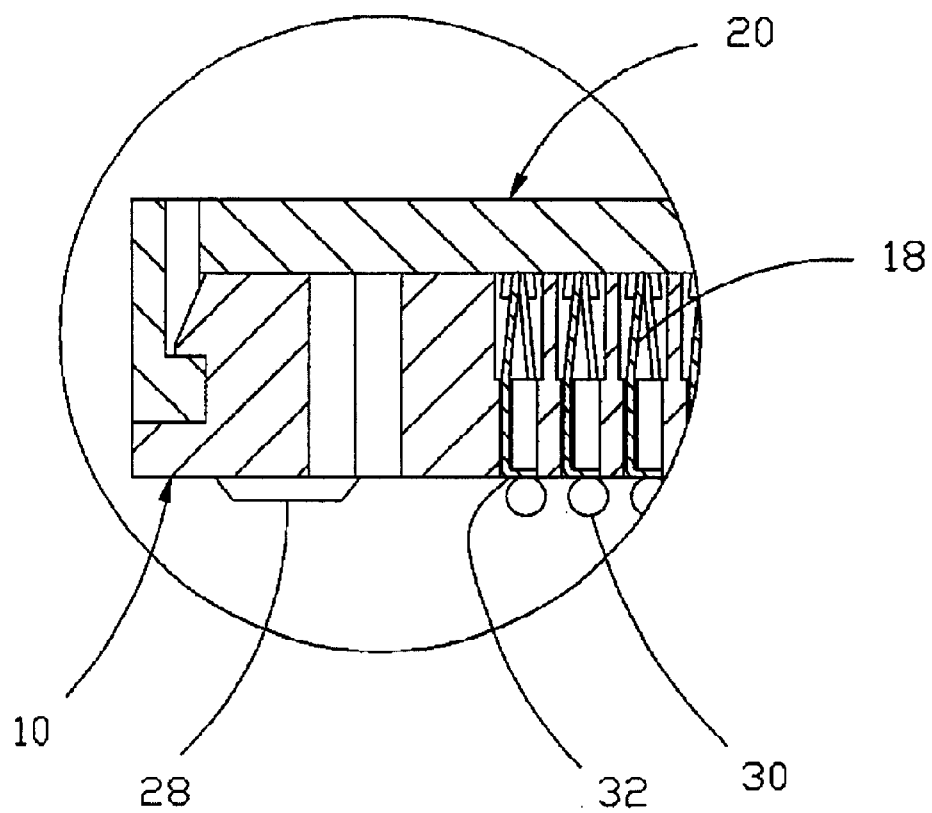
FIG. 8A is a partially enlarged view of FIG. 8.

As clearly shown in FIGS. 2, 4 and 6, the base 10 provides multiple stand-offs 28 on the bottom surface 16 thereof which are generally located at four corners of the base 10. The contacts 12 each have a solder ball 30 attached to a tail portion 32 thereof before the connector 1 is mounted onto a PC board 34 (FIGS. 8 and 8A). In macroscopic view, bottom tips of the all solder balls 30 lie in a same plane, but in microcosm, these bottom portions locate higher or lower than the plane.

Referring to FIGS. 7A–7D, the stand-offs 28 are extending from the bottom surface 16 of the base 10 and terminating at a plane, designated by "D", that is parallel with the bottom surface 16. Before heated, the solder ball 30 has a larger size than the stand-off 28 in a direction "B" which is perpendicular to the bottom surface 16 of the base 10. So, bottom tips 31 of the solder balls 30 extend downwardly a predetermined distance, preferably between 0.1 mm and 0.2 mm, beyond the "D" plane and the solder balls 30 instead of the stand-offs 28 support the connector 1. A gap 36 is defined between a bottom surface 38 of the stand-off 28 and an upper surface 40 of the PC board 34. The gap 36 is relative to the dimension of the stand-off 28 and the distance between the bottom surface 16 and the bottom tips of the solder balls 30. After heated, the solder balls become soft or melting and the connector 1 sinks toward the PC board 34 until the bottom surfaces 38 of the stand-offs 28 touch the upper surface 40 of the PC board 34. At this state, the stand-offs 28 support the connector 1 to avoid the soft or melting solder balls 30 from being collapsed and bridging to adjacent soft or melting solder balls 30 for no contamination. It can be contemplated that the dimension of the solder ball 30 should be within a proper range. If it is relatively too small, there is no sufficient solder for soldering, thus maybe jeopardizing the mechanical fastening effect and the electrical transmission effect. Oppositely, if it is relative too large, it wastes the material, improperly increases the weight and maybe tends to further contaminate the adjacent ones once melted. Correspondingly, the gap 36 also should be arranged within a proper range to comply with the dimension of the solder ball 30 for assuring the good mechanical and electrical connection between the solder balls 30 and the corresponding solder pads on the PC board. In this embodiment, the ratio between the gap 36 and the solder ball 30 is preferably around one third, particularly within 15%–25%. Understandably, the stand-off 28 extending from the base 10 and stationarily standing upon the PC board 34, may efficiently share some forces with the solder balls 30 for preventing excessive forces imposed upon the solder balls 30.

Figure 9:
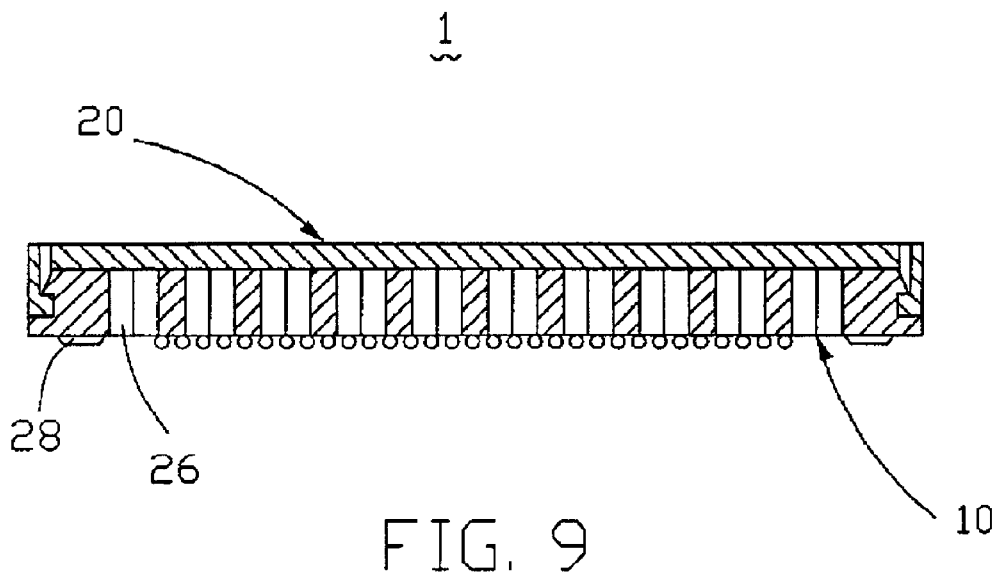
FIG. 9 is a cross-sectioned view taken along line IX—IX of FIG. 7C.
Figure 10:
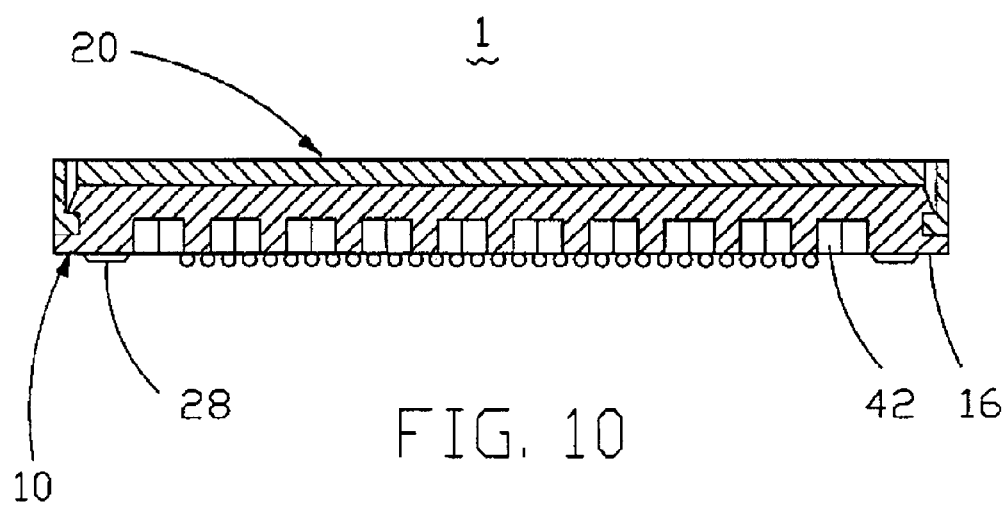
FIG. 10 is a view similar to FIG. 9 but illustrating a second structure of an electrical connector with respect to a second embodiment of the present invention.

Referring to FIGS. 9 and 10 in conjunction with FIGS. 4 and 6, in the first embodiment of the present invention, the base 10 defines the openings 26 through the top and the bottom surfaces 14, 16 thereof. In a second embodiment of the present invention, the base 10 defines a plurality of recesses 42 in the bottom surface 16 thereof which do not travel through the top surface 14 thereof. By defining the openings 26 or the recesses 42 which preferably substantially fully surround the central contact region, the base 10 uses less plastic material, lessens the weight thereof, and may further cooperate with the center hollow 24 to have a better performance of disseminating heat during the mount of the connector 1 to the PC board 34, and to facilitate the molding process.

Figure 11:
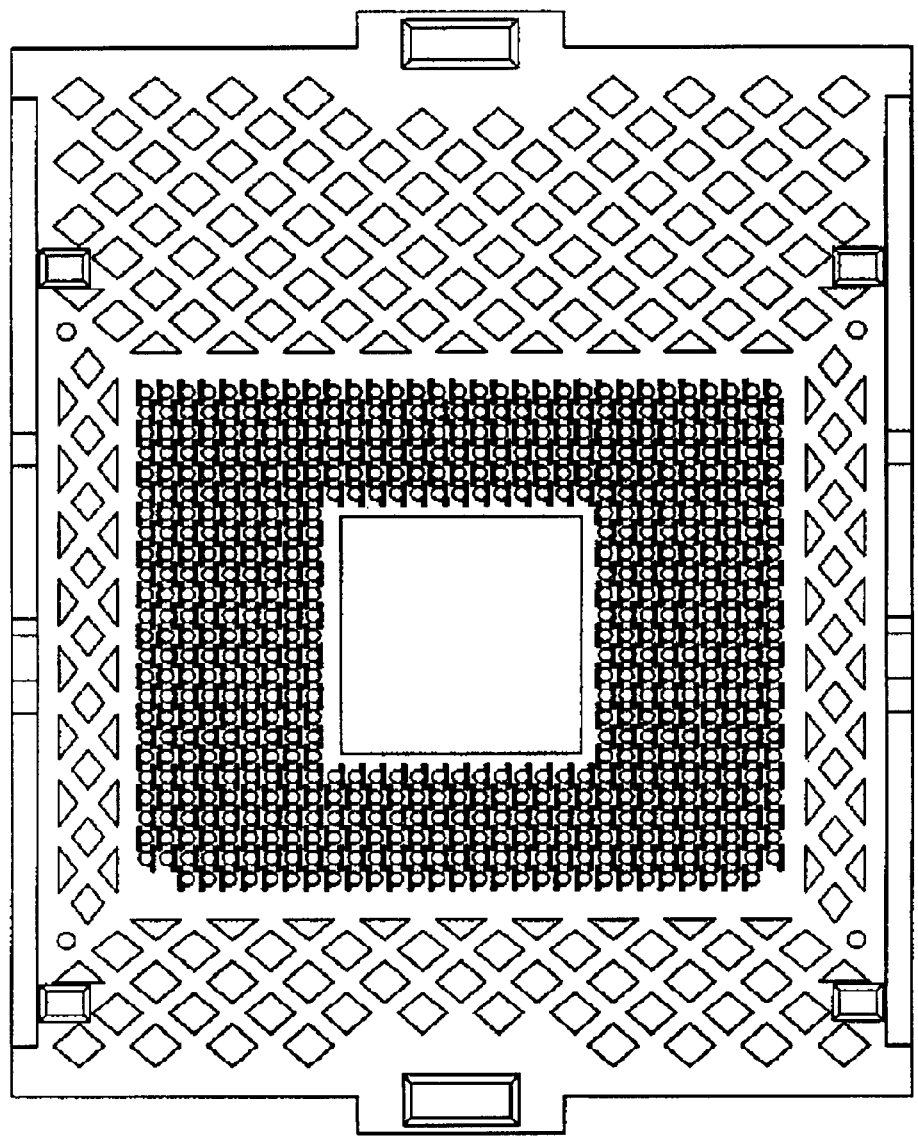
FIG. 11 is a bottom view of an electrical connector with respect to a third embodiment of the present invention.
Figure 12:
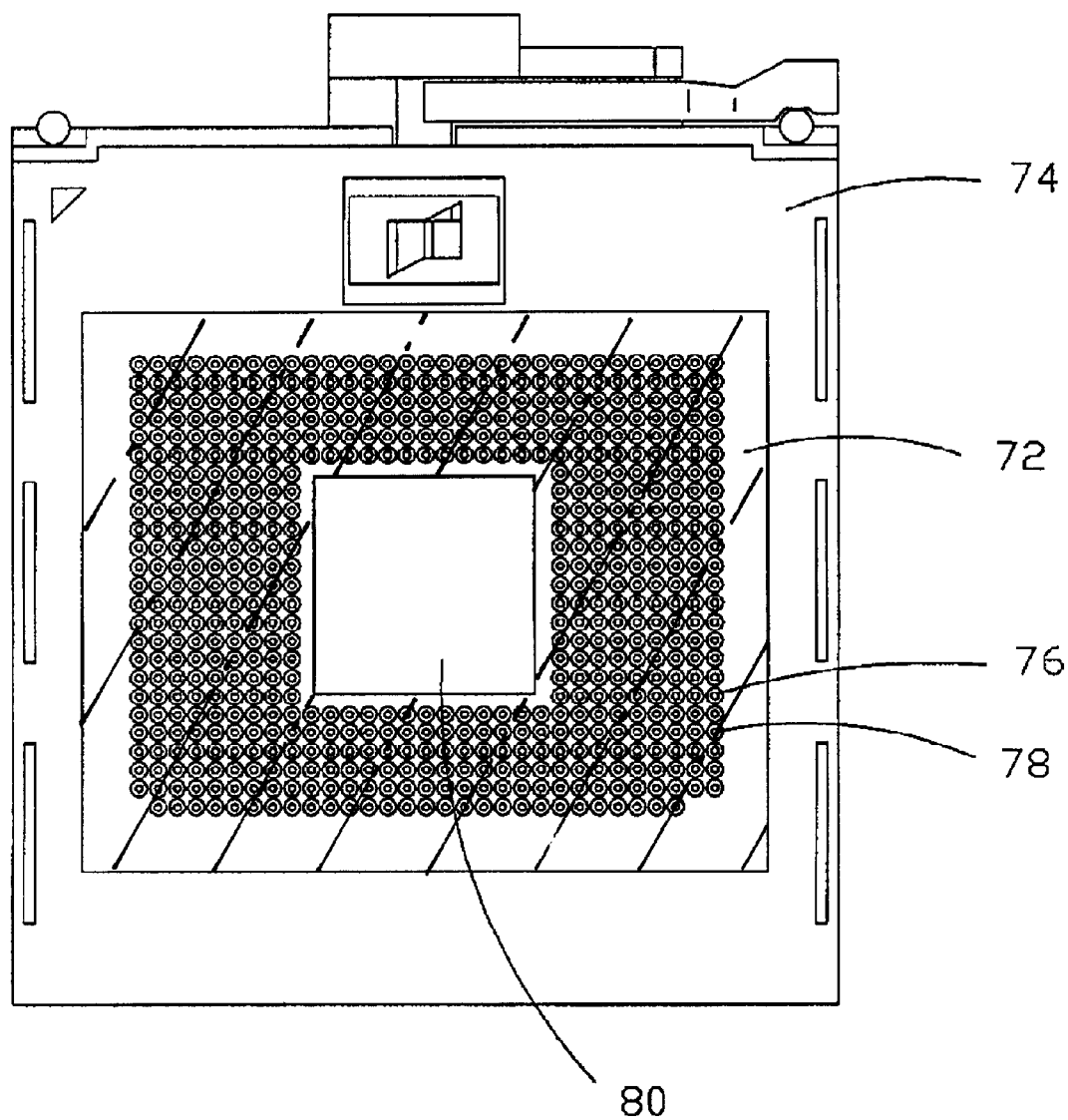
FIG. 12 is a top view of an electrical connector with respect to a fourth embodiment of the present invention.

Referring to FIGS. 11 and 12, a connector 60 of a third embodiment of this invention is similar to the connector 1 except that it does not have a driver latch. A connector 70 of a fourth embodiment of this invention is similar to the connector 1 except that it has an adhesive tape 72 attached to a top surface 74 thereof. The adhesive tape 72 preferably covers a matrix 76 defined by the all conductive contacts 78 and a hollow 80 at a center of the connector 70. Having the adhesive tape 72, the connector 70 can be picked up by a suction device (not shown) during the process of mounting the connector 70 onto a PC board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the, broad general meaning of the terms in which the appended claims are expressed.

What is claimed is:

1. A ball grid array socket connector adapted for electrically connecting an integrate circuit package assembly to a PC board, comprising:

an insulative base having a top surface, a bottom surface and defining a plurality of cavities through the top surface and the bottom surface, the cavities being generally arranged in a matrix;

a plurality of notches defined in the bottom surface of the base, the notches located at outer sides of the matrix of cavities;

a plurality of stand-offs downwardly protruding from the bottom surface of the base and terminating at a plane generally parallel with the bottom surface of the base;

a plurality of conductive contacts received in corresponding cavities of the base, each contact having a tail portion remained in the cavity;

a plurality of solder balls attached to the tail portions of corresponding contacts, each solder ball having a bottom tip downwardly extending beyond the plane that the stand-offs terminate at before the solder balls heated and melted, and the stand-offs adapted to support the socket connector onto the PC board after the solder balls heated and melted; and a cover attached to the top surface of the base and defining a matrix of apertures, the cover being movable relative the base along the top surface of the base between multiple locations, the apertures of the cover being aligned with corresponding cavities of the base at one of the multiple locations.

2. The ball grid array socket connector as claimed in claim 1, wherein at least one of the stand-offs is not aligned with the other stand-offs in the bottom surface of the base.

3. The ball grid array socket connector as claimed in claim 1, wherein the bottom tips of the solder balls generally extend beyond the plane that the stand-offs terminate by a distance between 0.1 mm and 0.2 mm.

4. A ball grid array socket connector adapted for electrically connecting an integrate circuit package assembly to a PC board, comprising:

a plurality of conductive contacts each having a solder ball attached to a tail thereof;

an insulative base having a top surface and a bottom surface and defining a hollow and a matrix of cavities around the hollow through the top surface and the bottom surface, the base including multiple stand-offs on the bottom surface thereof, each cavity receiving a corresponding contact and tail of the contact remained in the cavity, bottom tips of the solder balls extending a larger distance than the stand-offs away from the bottom surface before the solder balls heated and melted, the stand-offs being adapted to support the socket connector on the PC board after the solder balls heated and melted;

a plurality of notches defined in the bottom surface of the base, the notches locating at outer sides of the matrix of cavities; and a cover attached to the top surface of the base and defining a matrix of apertures, the cover being movable relative the base along the top surface of the base between multiple locations, the apertures of the cover being aligned with corresponding cavities of the base at one of the multiple locations.

5. The ball grid array socket connector as claimed in claim 4, wherein at least one of the stand-offs is not aligned with the other stand-offs.

6. The ball grid array socket connector as claimed in claim 4 further including a tape adhered to a top surface of the cover and covering the matrix of the apertures.

* * * * *

US006530798C1

(12) EX PARTE REEXAMINATION CERTIFICATE (10350th)

United States Patent
Li et al.

(10) Number: US 6,530,798 C1
(45) Certificate Issued: Oct. 22, 2014

(54) BALL GRID ARRAY SOCKET CONNECTOR

(76) Inventors: Ren-Chih Li, Tu-Chen (TW); Jwomin Wang, Hsin-Dan (TW); Yao-Chi Huang, Yung-Ho (TW)

Reexamination Request:
No. 90/009,869, Jan. 6, 2011

Reexamination Certificate for:
Patent No.: 6,530,798
Issued: Mar. 11, 2003
Appl. No.: 09/999,804
Filed: Oct. 24, 2001

(51) Int. Cl.
*H01R 13/625* (2006.01)
(52) U.S. Cl.
USPC .......................................................... 439/342
(58) Field of Classification Search
USPC .......................................................... 439/342
See application file for complete search history.

(56) References Cited

To view the complete listing of prior art documents cited during the proceeding for Reexamination Control Number 90/009,869, please refer to the USPTO's public Patent Application Information Retrieval (PAIR) system under the Display References tab.

*Primary Examiner* — Karin Reichle

(57) ABSTRACT

A ball grid array socket connector (1) includes an insulative base (10), a number of conductive contacts (18) fixed to the base, a number of solder balls (30) attached to tail portions (32) of corresponding contacts and a cover (20) movably attached to the base. The base has a top surface (14), a bottom surface (16) and defines a number of cavities (12) through the top surface and the bottom surface. The cavities are arranged in a matrix. The contacts are received in corresponding cavities of the base. The base provides a number of stand-offs (28) which downwardly protrude from the bottom surface of the base and terminate at a plane (D) generally parallel with the bottom surface of the base. The solder balls each have a bottom tip (31) that downwardly extends beyond the plane D. The base defines a number of notches (26) in the bottom surface thereof. The notches are located at outer sides of the matrix of cavities.

At the time of issuance and publication of this certificate, the patent remains subject to pending reissue application number 14/334,728 filed Jul. 18, 2014. The claim content of the patent may be subsequently revised if a reissue patent is issued from the reissue application.

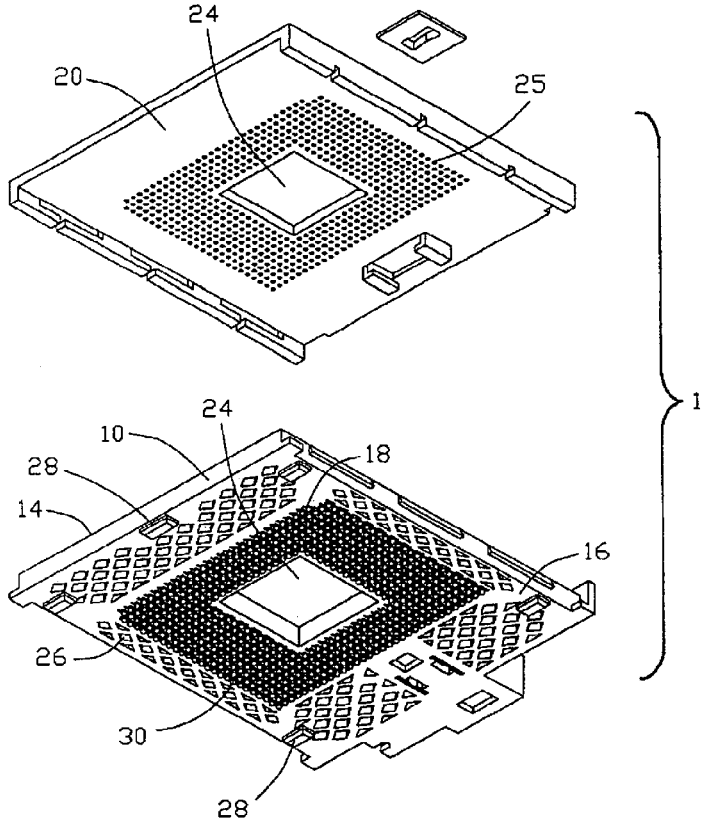

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claim 6 is confirmed.

Claims 1-5 are cancelled.

\* \* \* \* \*